US005200666A

United States Patent [19]

Walter et al.

[11] Patent Number: 5,200,666

[45] Date of Patent: Apr. 6, 1993

[54] ULTRASONIC TRANSDUCER

[75] Inventors: Martin Walter; Dieter Weber, both of Karlsbad, Fed. Rep. of Germany

[73] Assignee: Martin Walter Ultraschalltechnik G.m.b.H., Straubenhardt, Fed. Rep. of Germany

[21] Appl. No.: 665,995

[22] Filed: Mar. 7, 1991

[30] Foreign Application Priority Data

Mar. 9, 1990 [EP] European Pat. Off. ...... EP90104490

[51] Int. Cl.[5] .............................................. H01L 41/08

[52] U.S. Cl. .................................... 310/323; 310/325; 310/328

[58] Field of Search ......................... 310/323, 325, 328

[56] References Cited

U.S. PATENT DOCUMENTS

| | | | |
|---|---|---|---|
| 2,990,482 | 6/1961 | Kenny | 310/323 |
| 3,546,498 | 12/1970 | McMaster et al. | 310/323 |
| 3,578,993 | 5/1971 | Russell | 310/323 |
| 3,777,189 | 12/1973 | Skinner et al. | 310/328 |
| 3,975,698 | 8/1976 | Redman | 310/323 |
| 4,352,039 | 9/1982 | Hagood et al. | 310/328 |
| 4,537,511 | 8/1985 | Frei | 310/323 |

OTHER PUBLICATIONS

"Design of matching networks for acoustic transducers" by R. Coates et al., Ultrasonics, 1988 vol. 26, Mar.

*Primary Examiner*—Mark O. Budd
*Assistant Examiner*—Thomas M. Dougherty
*Attorney, Agent, or Firm*—Klaus J. Bach

[57] ABSTRACT

In an ultrasonic transducer for the transmission of ultrasonic energy to a liquid which has ultrasonic generators coupled to opposite ends of rod-like resonators which both operate at the same frequency to transmit ultrasonic vibration to the resonator to be emitted therefrom, no radiation is emitted from the ends occupied by the generators so that all radiation is emitted from the resonator in a desired radial fashion.

8 Claims, 1 Drawing Sheet

ULTRASONIC TRANSDUCER

BACKGROUND OF THE INVENTION

The invention relates to an apparatus for the transmission of ultrasonic energy of a predetermined wavelength to a liquid, which apparatus includes a rod or tube-like resonator of a length which is ½ the wavelength of the ultrasound or a multiple thereof and an ultrasonic generator which is adapted to generate longitudinal vibrations and which is coupled to the face of the resonator.

Such apparatus are utilized especially in ultrasonic cleaning equipment. In this equipment the ultrasonic generator is mounted on the wall of a liquid container with the resonator (radiating member) extending into the liquid in the container.

The longitudinal vibrations transmitted to the resonator from the generator coupled thereto are partially converted to transversal vibrations so that ultrasonic energy is emitted from the resonator in axial as well as in radial direction with respect to the resonator axis. Generally, however, only the radially emitted ultrasonic radiation is desirable; the longitudinally emitted radiation, that is, the radiation emitted from the face of the resonator, can usually not be utilized. In order to convert the longitudinal vibration as supplied to the resonator to a large degree into vibration emitted radially from the resonator, it has been proposed (U.S. Pat. No. 4,537,511) to mount the resonator to the face of the ultrasonic generator at a point with a longitudinal vibration maximum and to tune the length of the resonator to an integral multiple of ½ the wavelength (lambda/2) of the longitudinal vibration supplied to the resonator by the ultrasonic generator. By coupling the resonator to the generator at a point of maximum vibration thereof the full energy output of the generator is transmitted to the resonator thereby providing for maximal radiation results particularly with its length tuned to the frequency of the ultrasonic generator. However, even with this known arrangement there are the undesirable losses as a result of longitudinally emitted vibration.

It is the object of the present invention to provide an apparatus which eliminates to a large degree the longitudinally emitted vibration and the resulting losses, that is, a transducer in which the longitudinal vibration supplied to the resonator by the ultrasonic generator is effectively fully transformed into transverse radial radiation.

SUMMARY OF THE INVENTION

An ultrasonic transducer for the transmission of ultrasonic energy of a predetermined wavelength to a liquid comprises a rod-like resonator of a length which is an integral multiple of ½ of the predetermined wavelength and similar ultrasonic generators coupled to opposite ends of the resonator rod. The ultrasonic generators are adapted to operate in synchronism to supply ultrasonic vibration from both ends to the resonator rod from which the ultrasonic vibration is emitted radially.

In the arrangement according to the invention the resonator does not have a free end face from which longitudinal vibrations could be emitted; rather the end face carries another similar ultrasonic generator coupled to the resonator which not only prevents longitudinal emission of ultrasonic radiation from the resonator but which supplies additional ultrasonic energy to the resonator. As a result, such an arrangement, with essentially the same geometric dimensions of earlier arrangements, can emit twice the amount of ultrasonic energy radially into the liquid without losses by longitudinal ultrasonic emissions. The emission of radiation from the resonator can be maximized by making the transducer symmetrical with respect to a central cross-section thereof so that the ultrasonic energy supplied to the resonator from the generators at opposite ends and the ultrasonic energy emitted from opposite sides of the center of the resonator are the same and correspond to the respective maximum. In such an arrangement the resonator may be solid or it may be hollow. A solid resonator has the advantage of greater durability since it is not subjected so much to cavitational erosion as a hollow bodied resonator is. On the other hand, a hallow resonator provides for greater vibration amplitudes and is therefore somewhat more effective than a solid resonator.

The ultrasonic generators at opposite ends of the resonator may be adapted to operate in phase or in phase opposition. The determining factor is the length of the resonator which is either an integral even or an integral uneven multiple number of ½ lambda. This permits optimal adaptation of the length of the transducer to the size of the selected container.

Finally, it is noted that preferably power is supplied to the additional ultrasonic generator through the resonator in order to eliminate a separate power supply.

DESCRIPTION OF THE PREFERRED EMBODIMENT

Figure 1:
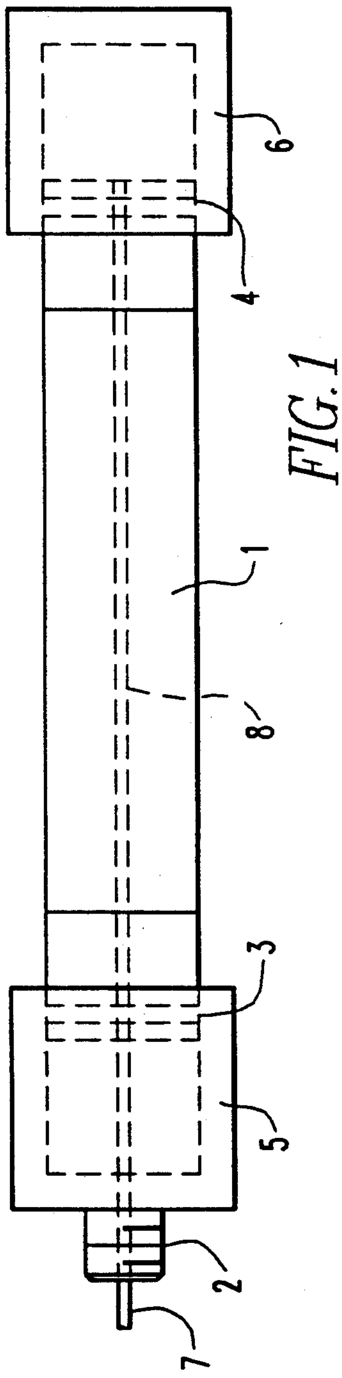
FIG. 1 shows an ultrasonic transducer with a solid resonator.

An ultrasonic transducer as shown in FIG. 1 comprises a sound wave emitting resonator 1 having disposed at its opposite ends similar or essentially identical ultrasonic generators 5, 6 coupled to the opposite faces of the resonator 1 by means of vibration transmitting matching pads 3, 4 and adapted to be operated in synchronism. The generators 5, 6 are totally encapsulated so that the whole arrangement can be immersed into a liquid. At one end, the transducer is provided with means 2, such as a threaded stud, to mount it on the wall of a container. Encapsulation of the ultrasonic generators and any countermasses at the ends of the resonator 1 also prevents the escape of longitudinal sound waves into the surrounding liquid. Power is supplied to the transducer 5 preferably by way of a power supply 7 extending through the stand 2 and from the transducer 5 to the transducer 6 by a line 8 extending through the resonator 1 or 11.

During operation of the transducer the two ultrasonic generators 5, 6 are energized in synchronism and, for example, in phase. They transmit longitudinal ultrasonic vibration to the resonator 1 which is converted to transversal radially emitted vibrations in a manner known from the prior art. The resonator 1 has a length of ½ lambda or an integral multiple thereof.

Figure 2:
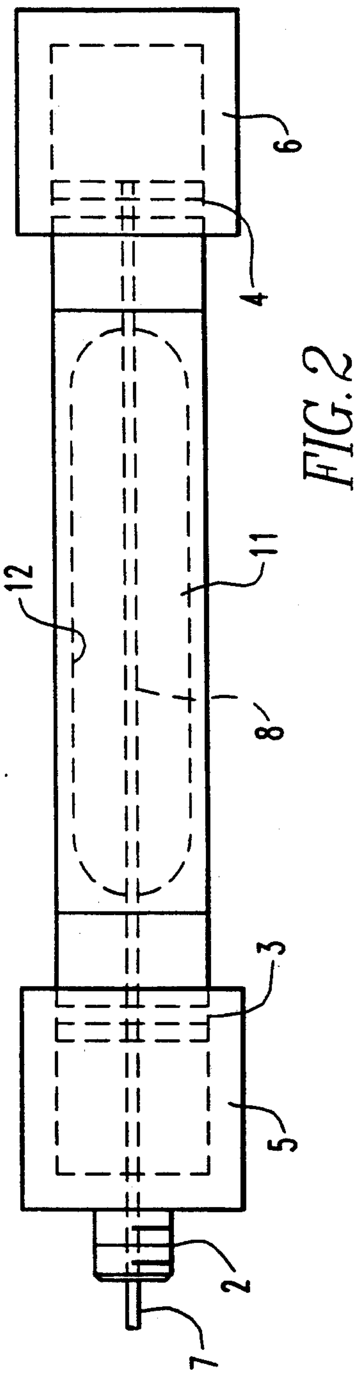
FIG. 2 shows an ultrasonic transducer with a hollow resonator.

FIG. 2 shows essentially the same arrangement as shown in FIG. 1. It includes however a resonator 11 which is tubular or hollow as indicated by dashed line 12.

Both figures show the resonator and the ultrasonic generator faces coupled with faces of the same diameter. It is noted however that the diameter of the resonator may be larger or it may be smaller than the face diameter of the generator where they are coupled.

What is claimed is:

1. An ultrasonic transducer for the transmission of ultrasonic energy of a predetermined wavelength to a liquid, comprising: a rod-like resonator of a length between opposite end faces thereof which is ½ or a multiple thereof of said predetermined wavelength and an ultrasonic generator with an ultrasonic energy emitting end structure coupled to each of the opposite end faces of said rod-like resonator, said ultrasonic generators being adapted to operate synchronized at the same frequency for providing longitudinal ultrasonic vibration waves of the same wavelength to said resonator from its opposite ends for simultaneous synchronized energization of said rod-like resonator from its opposite ends so as to provide for efficient ultrasonic signal emission radially from said rod-like resonator.

2. An ultrasonic transducer according to claim 1, wherein said transducer is essentially symmetrical with respect to a central cross-sectional plane thereof thereby to optimize radial emission from said resonator.

3. An ultrasonic transducer according to claim 1, wherein said resonator is hollow.

4. An ultrasonic transducer according to claim 1, wherein said resonator is a solid rod.

5. An ultrasonic transducer according to claim 1, wherein said ultrasonic generators are coupled to the end faces of the resonator by means of vibration transmitting matching pads.

6. An ultrasonic transducer according to claim 1, wherein said ultrasonic generators at opposite ends of the resonator are adapted to operate with in-phase synchronism.

7. An ultrasonic transducer according to claim 1, wherein said ultrasonic generators at opposite ends of the resonator are adapted to operate with phase-opposition synchronism.

8. An ultrasonic transducer according to claim 1, wherein one of said ultrasonic generators includes mounting means and a power supply extends from said one ultrasonic generator to the other through said resonator.

* * * * *